(12) United States Patent
Abe

(10) Patent No.: US 7,924,388 B2
(45) Date of Patent: Apr. 12, 2011

(54) LIQUID CRYSTAL DISPLAY DEVICE

(75) Inventor: Hideaki Abe, Chiba (JP)

(73) Assignee: Hitachi Displays, Ltd., Chiba (JP)

( * ) Notice: Subject to any disclaimer, the term of this patent is extended or adjusted under 35 U.S.C. 154(b) by 323 days.

(21) Appl. No.: 11/940,388

(22) Filed: Nov. 15, 2007

(65) Prior Publication Data

US 2008/0117367 A1  May 22, 2008

(30) Foreign Application Priority Data

Nov. 16, 2006  (JP) .................................. 2006-310117

(51) Int. Cl.
*G02F 1/1345* (2006.01)
*G02F 1/1333* (2006.01)

(52) U.S. Cl. ..................... 349/150; 349/152; 349/158

(58) Field of Classification Search .................. 349/152, 349/150, 158, 160
See application file for complete search history.

(56) References Cited

U.S. PATENT DOCUMENTS

| 6,172,730 B1* | 1/2001 | Fujita .............................. 349/149 |
| 7,360,940 B2* | 4/2008 | Chang et al. ................... 362/631 |
| 7,505,107 B2* | 3/2009 | Takaishi ......................... 349/149 |
| 2005/0018102 A1* | 1/2005 | Hirano ............................ 349/58 |
| 2005/0237467 A1* | 10/2005 | Takaishi ......................... 349/149 |

FOREIGN PATENT DOCUMENTS

JP  2005-338497  12/2005

* cited by examiner

*Primary Examiner* — Wen-Ying P Chen
(74) *Attorney, Agent, or Firm* — Antonelli, Terry, Stout & Kraus, LLP.

(57) ABSTRACT

An object of the invention is to reduce the size of a liquid crystal display device and to enhance the reliability of a connection portion with a flexible wiring substrate. According to the invention, liquid crystal is sandwiched between a TFT substrate and a color filter substrate. The TFT substrate is formed in a larger size than that of the color filter substrate. A connection portion with a flexible wiring substrate is formed on the TFT substrate. The TFT substrate is formed with a notch at its portion connected with the flexible wiring substrate. The flexible wiring substrate is bent over the notch toward a rear side of the liquid crystal display device as accommodated in a mold. This allows for the size reduction of the overall display device and ensures the enhanced reliability of the connection portion.

12 Claims, 13 Drawing Sheets

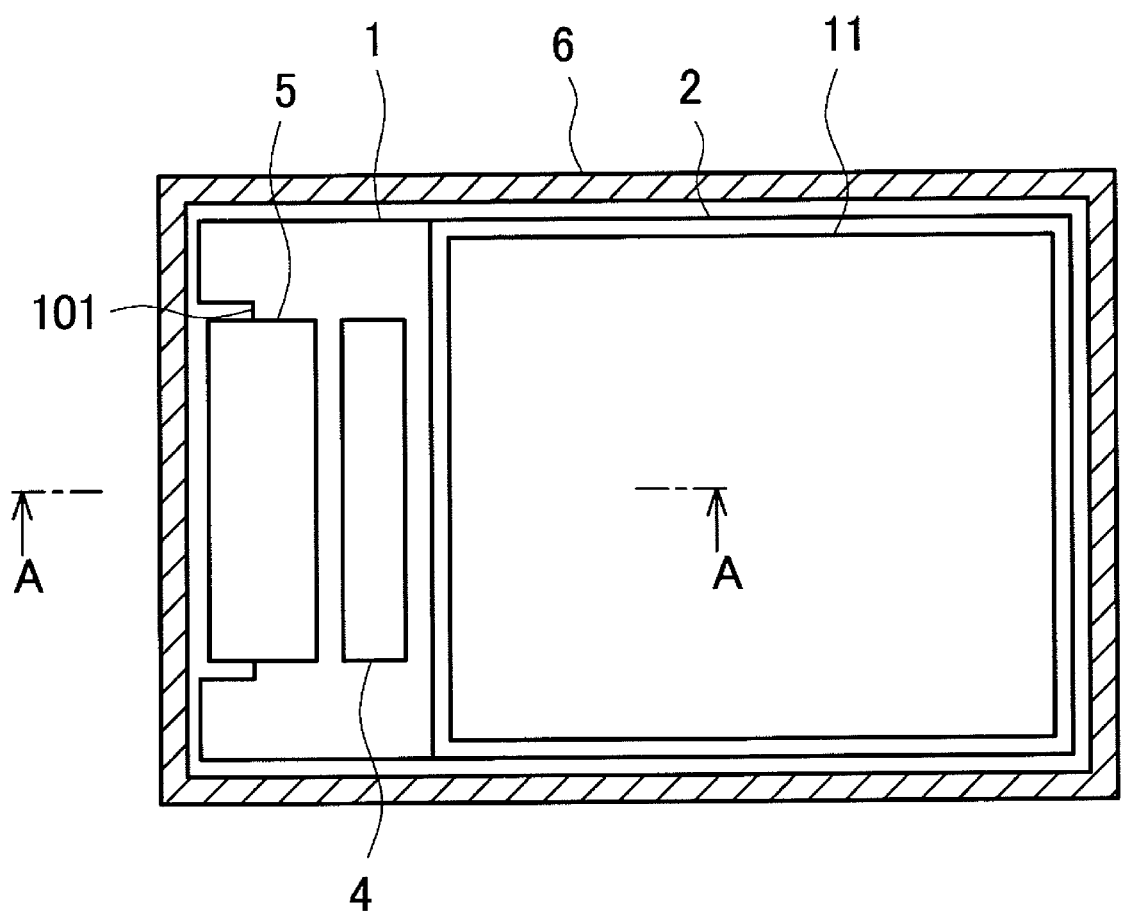

FIG. 20A (PRIOR ART)
FIG. 20C (PRIOR ART)
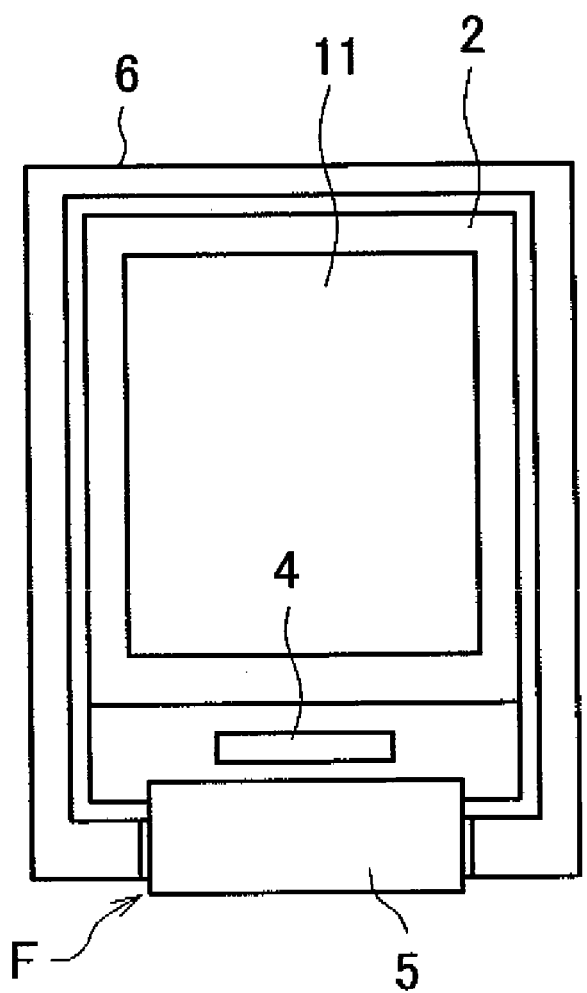
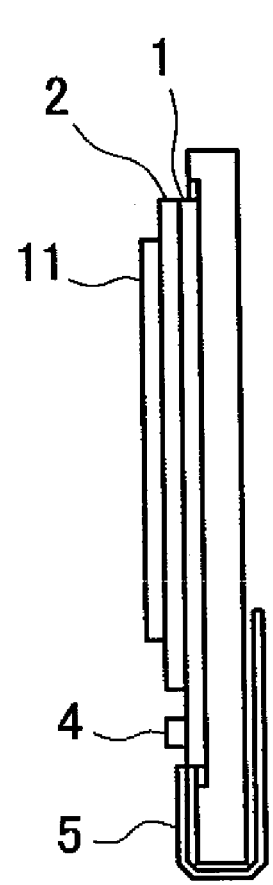
FIG. 20B (PRIOR ART)
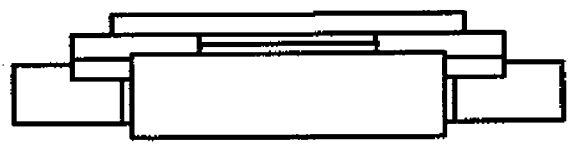

LIQUID CRYSTAL DISPLAY DEVICE

CROSS-REFERENCE TO RELATED APPLICATIONS

The disclosure of Japanese Patent Application No. 2006-310117 filed on Nov. 16, 2006 including the specification, drawings and abstract is incorporated herein by reference in its entirety.

BACKGROUND

1. Field of the Invention

The present invention relates to a liquid crystal display device and particularly to a technique for reducing the physical size of a set and enhancing the reliability of a connection portion with an external circuit.

2. Description of Related Arts

The liquid crystal display devices have been faced with a strong demand to reduce the physical size of the unit while maintaining the same screen size. This demand is particularly strong in display devices, such as liquid crystal display device for use in cellular telephones, in which the reduction of the physical size of the unit is desired.

FIG. 20 shows a structure of a module used in a conventional compact liquid crystal display device. FIG. 20A is a plan view of the module; FIG. 20B is a side view thereof; and FIG. 20C is a side view thereof as seen in the other direction. A liquid crystal display panel comprises a TFT substrate 1 and a color filter substrate 2 which are disposed in opposing relation. The TFT substrate 1 is constructed such that pixel electrodes and TFTs (thin film transistor) as switching elements corresponding thereto are arranged in a matrix form. The color filter substrate 2 is formed with a color filter for color image formation. Liquid crystal is sandwiched between the TFT substrate 1 and the color filter substrate 2, and an image is formed by controlling light from a backlight. The control of light through liquid crystal requires the light to be polarized. Hence, an unillustrated lower polarizer is affixed to a lower side of the TFT substrate 1 whereas an upper polarizer 11 is affixed to an upper side of the color filter. The TFT substrate 1, the color filter substrate 2, the unillustrated lower polarizer and the upper polarizer 11 constitute the liquid crystal display panel.

FIG. 20A is a plan view showing an arrangement wherein the liquid crystal display panel, which is provided with a driving IC chip 4, a flexible wiring substrate 5 connected with an external power source or the like and the backlight, is installed in a mold 6. Referring to FIG. 20A, the driving IC chip 4 and the flexible wiring substrate 5 are mounted to the TFT substrate 1 and hence, the TFT substrate 1 has a larger size than that of the color filter substrate accordingly. The color filter substrate 2 has the upper polarizer 11 affixed to the upper side thereof. The liquid crystal display panel having the driving IC chip 4, the flexible wiring substrate 5 and the like mounted thereto is installed in the mold 6.

The flexible wiring substrate 5 is so elongated as to occupy a substantial space. Therefore, the flexible wiring substrate is bent over one side of the mold 6 to extend to a back side of the mold 6 so that the display device may be made compact. FIG. 20B and FIG. 20C show how the flexible wiring substrate is bent. Referring to FIG. 20C, the backlight is disposed in the mold 6 at place beneath the liquid crystal display panel for applying light through the back side of the liquid crystal display panel. The aforementioned subassembly wherein the liquid crystal display panel and the like are installed in the mold 6 is housed in a frame 7. The frame 7 is normally formed from a metal. Such a constitution is disclosed in, for example, Japanese Patent Laid-Open No. 338497/2005 (Patent Document 1).

SUMMARY

Referring to FIG. 20 showing the conventional example, the flexible wiring substrate 5 is bent backward to the opposite side of the mold 6 as covering one side of the mold 6. The structure wherein the flexible wiring substrate 5 is bent backward to the back side of the mold 6 as covering one side of the mold 6 has limitations in reducing the physical size of the overall display device. Furthermore, such a structure also involves a potential fear that if an external force as denoted by F in FIG. 20A is applied to the flexible wiring substrate 5, the flexible wiring substrate 5 may be separated from the TFT substrate 1. Such a problem is more likely to occur particularly before the mold 6 is housed in the frame 7.

The TFT substrate 1 and the flexible wiring substrate 5 are connected with each other by means of an anisotropic conductive film, and it is desirable to minimize the aforementioned potential fear of the flexible wiring substrate 5 separated from the TFT substrate 1. If the flexible wiring substrate 5, as bent backward, can be installed in the mold 6, it is easy to handle the flexible wiring substrate 5 and besides, the flexible wiring substrate 5 may encounter less chance to be subjected to the external force. Unfortunately however, the physical size of the mold 6 must be increased to allow the flexible wiring substrate 5 in the bent form to be installed therein. That is, the physical size of the mold 6 must be increased by an amount equivalent to a bend allowance of the flexible wiring substrate 5.

It is an object of the invention to overcome the above problems so as to provide a construction which allows for the procedure of connecting the flexible wiring substrate with the TFT substrate and installing the flexible wiring substrate which is bent over toward the back side as accommodated in the mold 6. The concrete means to accomplish the invention will be stated as follows.

In accordance with a first aspect of the invention, a liquid crystal display device comprises a liquid crystal display panel including: a TFT substrate comprising pixel electrodes and TFTs (thin film transistor) for controlling a signal to the pixel electrodes arranged in matrix; and a color filter substrate disposed in opposing relation with the TFT substrate and formed with color filters in correspondence to the pixel electrodes, the TFT substrate formed with a terminal portion for applying an external signal to the TFTs, the display device characterized in that the terminal portion is formed at a recessed portion formed at a side of the TFT substrate.

In accordance with a second aspect of the invention, the liquid crystal display device according to the first aspect hereof is characterized in that the recessed portion has a depth of 0.2 mm to 1 mm.

In accordance with a third aspect of the invention, the liquid crystal display device according to the first aspect hereof is characterized in that the terminal portion is connected with a flexible wiring substrate and the flexible wiring substrate is bent over the recessed portion toward a rear side of the TFT substrate.

In accordance with a fourth aspect of the invention, the liquid crystal display device according to the first aspect hereof is characterized in that a line interconnecting the side of the TFT substrate and a side, along which the terminals of the recessed portion are arranged, forms an obtuse angle with respect to the side of the TFT substrate.

In accordance with a fifth aspect of the invention, the liquid crystal display device according to the first aspect hereof is characterized in that a line interconnecting the side of the TFT substrate and a side, along which the terminals of the recessed portion are arranged, includes a rounded portion.

In accordance with a sixth aspect of the invention, a liquid crystal display device comprises a liquid crystal display panel including: a TFT substrate comprising pixel electrodes and TFTs (thin film transistor) for controlling a signal to the pixel electrodes arranged in matrix; and a color filter substrate disposed in opposing relation with the TFT substrate and formed with color filters in correspondence to the pixel electrodes, the TFT substrate formed with a terminal portion for applying an external signal to the TFTs, wherein a backlight is formed at place on a rear side of the liquid crystal display panel, and wherein the liquid crystal display panel and the backlight are accommodated in a mold, the display device characterized in that the terminal portion is formed at a recessed portion formed at a side of the TFT substrate, and that the terminal portion is connected with a flexible wiring substrate.

In accordance with a seventh aspect of the invention, the liquid crystal display device according to the sixth aspect hereof is characterized in that the recessed portion has a depth of 0.2 mm to 1 mm.

In accordance with an eighth aspect of the invention, the liquid crystal display device according to the sixth aspect hereof is characterized in that the flexible wiring substrate is bent over the recessed portion toward a rear side of the TFT substrate and is extended to place on a back side of the backlight.

In accordance with a ninth aspect of the invention, the liquid crystal display device according to the sixth aspect hereof is characterized in that the flexible wiring substrate is bent over toward a rear side of the TFT substrate as accommodated in the mold.

In accordance with a tenth aspect of the invention, the liquid crystal display device according to the sixth aspect hereof is characterized in that a light emitting diode is mounted to the flexible wiring substrate and the light emitting diode serves as light source of the backlight due to the flexible wiring substrate extended to place on a back side of the backlight.

In accordance with an eleventh aspect of the invention, a liquid crystal display device comprises a liquid crystal display panel including: a TFT substrate comprising pixel electrodes and TFTs (thin film transistor) for controlling a signal to the pixel electrodes arranged in matrix; and a color filter substrate disposed in opposing relation with the TFT substrate and formed with color filters in correspondence to the pixel electrodes, the TFT substrate formed with a terminal portion for applying an external signal to the TFTs, wherein a backlight is formed at place on a rear side of the liquid crystal display panel, and wherein the liquid crystal display panel and the backlight are accommodated in a mold which is provided with a frame at a bottom thereof, the display device characterized in that the terminal portion is formed at a recessed portion formed at a side of the TFT substrate, and that the terminal portion is connected with a flexible wiring substrate.

In accordance with a twelfth aspect of the invention, the liquid crystal display device according to the eleventh aspect hereof is characterized in that the recessed portion has a depth of 0.2 mm to 1 mm.

In accordance with a thirteenth aspect of the invention, the liquid crystal display device according to the eleventh aspect hereof is characterized in that the flexible wiring substrate is bent over the recessed portion toward a rear side of the TFT substrate and is extended to place on a back side of the backlight.

In accordance with a fourteenth aspect of the invention, the liquid crystal display device according to the eleventh aspect hereof is characterized in that the flexible wiring substrate is bent over toward a rear side of the TFT substrate as accommodated in the mold.

In accordance with a fifteenth aspect of the invention, a liquid crystal display device comprises a liquid crystal display panel including: a TFT substrate comprising pixel electrodes and TFTs (thin film transistor) for controlling a signal to the pixel electrodes arranged in matrix; and a color filter substrate disposed in opposing relation with the TFT substrate and formed with color filters in correspondence to the pixel electrodes, the TFT substrate formed with a terminal portion for applying an external signal to the TFTs, wherein a backlight is formed at place on a rear side of the liquid crystal display panel, and wherein the liquid crystal display panel and the backlight are accommodated in a mold which is housed in a frame, the display device characterized in that the terminal portion is formed at a recessed portion formed at a side of the TFT substrate, that the terminal portion is connected with a flexible wiring substrate, and that the flexible wiring substrate is bent over the recessed portion toward a back side of the backlight.

The invention adopts the above means thereby achieving the reduction of physical size of the overall display device and enhancing the reliability of connection between the flexible wiring substrate and the liquid crystal display panel. The above means offer the following effects, respectively.

According to the means of the first to fifth aspects hereof, the recessed portion is formed at the portion where the terminals of the TFT substrate of the liquid crystal display panel are formed, and the flexible wiring substrate for supplying the signal from the external circuit, power and the like is connected via the recessed portion. The flexible wiring substrate is bent over the recessed portion toward the rear side of the liquid crystal display panel and hence, the flexible wiring substrate is accommodated in the recessed portion of the TFT substrate. This eliminates the problem that the flexible wiring substrate, which is bent, is protruded to outside so that the physical size of the display device is increased.

According to the means of the sixth to tenth aspects hereof, the recessed portion is formed at the portion where the terminals of the TFT substrate of the liquid crystal display panel are formed, and the flexible wiring substrate for supplying the signal from the external circuit, power and the like is connected via the recessed portion. The flexible wiring substrate is further extended toward the back side of the backlight disposed at place on the rear side of the liquid crystal display panel. The liquid crystal display panel and the backlight are accommodated in the mold. The recessed portion is formed at the terminal portion of the TFT substrate thereby allowing the flexible wiring substrate to be bent over the recessed portion toward the rear side. Therefore, the flexible wiring substrate is accommodated in the recessed portion of the TFT substrate so that the flexible wiring substrate may be accommodated in the mold. Consequently, the display device as a whole may be reduced in the physical size. Further, the flexible wiring substrate may encounter less chance to be subjected to the external force to separate the flexible wiring substrate from the terminal portion so that the reliability of the terminal connection is enhanced.

According to the means of the eleventh to fourteenth aspects hereof, the recessed portion is formed at the portion where the terminals of the TFT substrate of the liquid crystal display panel are formed, and the flexible wiring substrate for supplying the signal from the external circuit, power and the like is connected via the recessed portion. The flexible wiring substrate is further extended toward the back side of the backlight disposed at place on the rear side of the liquid crystal display panel. The liquid crystal display panel and the backlight are accommodated in the mold. Since the bottom of the mold is covered by the frame, it is easy to prevent the leakage of light from the light emitting diode as the light source of the backlight. Therefore, in addition to the effect to reduce the physical size of the display device as described with reference to the means of the sixth to tenth aspects hereof, the invention offers the effect to increase the use efficiency of the light from the backlight.

According the means of the fifteenth aspect in combination with the fourteenth aspect hereof, the use efficiency of the light from the backlight is further increased because the mold is housed in the frame. In addition, optical members of the backlight and the like may be retained in the frame in a stable manner.

BRIEF DESCRIPTION OF THE DRAWINGS

FIG. 9 is a plan view showing the liquid crystal display panel and the flexible wiring substrate assembled in a mold;

FIG. 20A shows a plan view of an example of a conventional liquid crystal display device, and FIGS. 20B and 20C show different side views thereof.

DETAILED DESCRIPTION OF THE INVENTION

Specific contents of the invention will be disclosed with reference to the embodiments thereof.

First Embodiment

Figure 1:
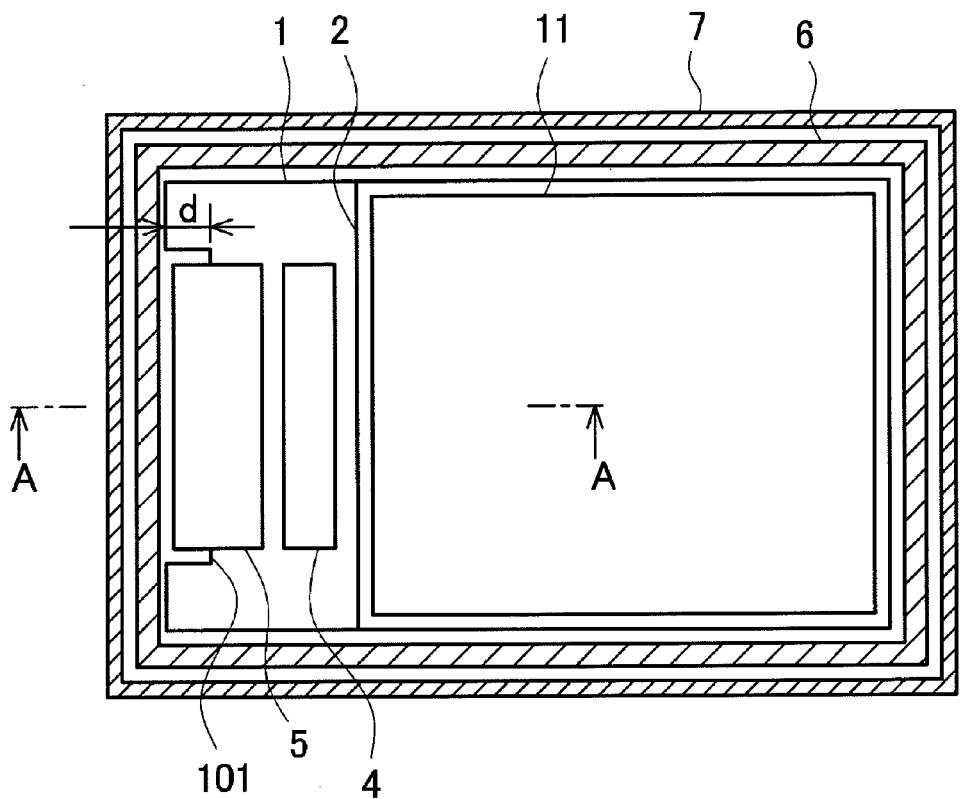
FIG. 1 is a plan view of a first embodiment of the invention.
Figure 2:
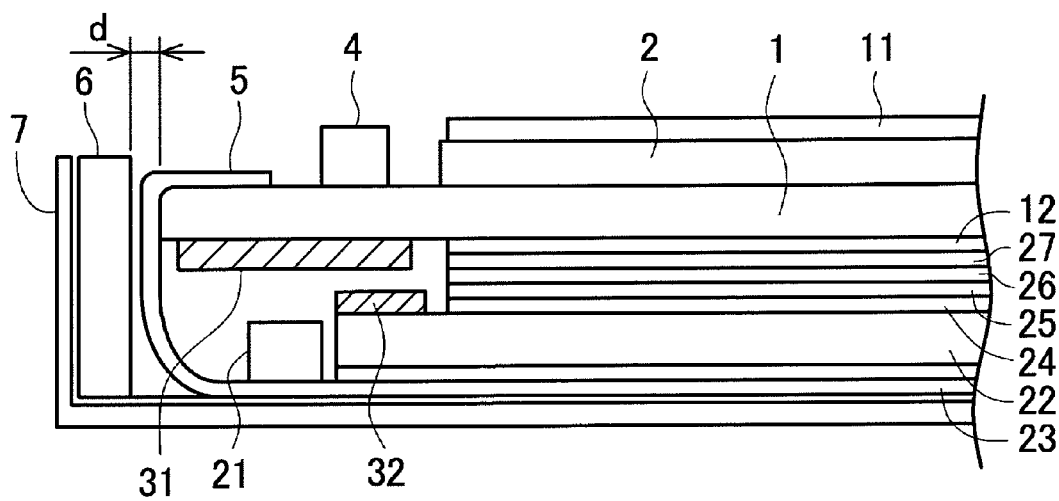
FIG. 2 is a sectional view taken on the line A-A in FIG. 1.

FIG. 1 is a plan view showing a first embodiment of the invention. FIG. 2 is a sectional view taken on the line A-A in FIG. 1. Referring to FIG. 1, a color filter substrate 2 of a liquid crystal display panel is disposed on a TFT substrate 1. The color filter substrate 2 has an upper polarizer 11 affixed to an upper side thereof. The upper polarizer 11 substantially corresponds to a viewing screen of the liquid crystal display panel. Mounted on one side of the TFT substrate 1 are a driving IC chip 4 for driving the liquid crystal display panel and a flexible wiring substrate 5 for connection with an external circuit.

The TFT substrate 1 is formed with a notch 101 at a portion where the flexible wiring substrate 5 is mounted. The depth of the notch 101 is represented as "d". The thickness and bend allowance of the flexible wiring substrate 5 are accommodated by the notch 101. The flexible wiring substrate 5 is installed in a mold 6 as bent over toward a lower side of the liquid crystal display panel. After the liquid crystal display panel and the flexible wiring substrate 5 are installed in the mold 6, therefore, the flexible wiring substrate 5 will encounter less chance to be subjected to an external force to separate the flexible wiring substrate from the liquid crystal display panel. Subsequently, the mold 6 is housed in a metal frame 7 normally formed from a metal. The embodiment is designed such that the physical size of the mold 6 is increased little although the flexible wiring substrate 5 as bent relative to the liquid crystal display panel is installed in the mold 6.

FIG. 2 is a sectional view taken on the line A-A in FIG. 1. Referring to FIG. 2, an unillustrated liquid crystal layer is formed between the TFT substrate 1 and the color filter substrate 2. The liquid crystal layer has a thickness on the order of microns. The TFT substrate 1 or the color filter substrate 2 is formed of a glass substrate, having a thickness of about 0.5 mm. In a case where the whole body of the display device need be reduced in thickness, the thickness of the glass substrate may sometimes be reduced to 0.2 mm or so by polishing an outer side thereof. A lower polarizer 12 is affixed to a lower side of the TFT substrate 1, whereas the upper polarizer 11 is affixed to the upper side of the color filter substrate 2. The driving IC chip 4 for driving pixel TFTs is mounted on the TFT substrate 1.

The flexible wiring substrate 5 is mounted to an end of the TFT substrate 1. The flexible wiring substrate 5 is provided with not only devices for supplying signal and power to the driving IC chip but also an LED 21 as a light source of a backlight, a driving circuit of the LED 21 and the like. As set in a module, the flexible wiring substrate 5 is bent over toward the rear side of the liquid crystal display panel. A gap of the width d exists between an inner side of the mold 6 and the end of the TFT substrate 1 because of the notch 101 formed in the TFT substrate 1. The width d provides space to accommodate the width and bend allowance of the flexible wiring substrate 5.

Referring to FIG. 2, the TFT substrate 1 is mounted to a supporting portion disposed at an unillustrated side of the mold 6. The mold 6 accommodates therein the backlight for applying light through the back side of the liquid crystal display panel. The mold 6 is formed from an organic resin. Since the mold is formed from the organic resin, there is no fear that the mold may cause cracks in the TFT substrate 1 or the color filter substrate 2 which is formed from glass, when the mold makes contact with such a glass substrate. The light emitting diode (LED 21) serving as the light source of the backlight is mounted to the flexible wiring substrate 5 in a manner to emit the light to a lateral side of a light guide plate 22 of the backlight as located on a portion of the flexible wiring substrate 5 which is bent over to extend to the rear side of the liquid crystal display panel. A TFT-substrate light shielding film 31 is formed on the lower side of the TFT substrate 1 at place opposite the LED 21. Further, a light shielding film 32 for light guide plate is also formed on a part of an upper side of the light guide plate 22 so as to prevent light leakage.

The light from the LED 21 is incident on the lateral side of the light guide plate 22. The light guide plate 22 plays the role of directing the light from the backlight entering through the lateral side of the light guide plate to a primary surface of the liquid crystal display panel. The light guide plate 22 is provided with a reflection sheet 23 on a back side thereof. The reflection sheet is used for redirecting the light, which moves toward an opposite side from the liquid crystal display panel, back to the liquid crystal display panel thereby increasing the use efficiency of the light. A lower diffusion sheet 24 is disposed on the light guide plate 22. One or more LEDs 21 are disposed at place near the lateral side of the light guide plate 22. The LED 21 is a point light source and hence, the light beams incident on the light guide plate 22 are not uniform. In addition, outgoing light beams from the light guide plate 22 are not uniform. Therefore, the lower diffusion sheet 24 is provided to uniformalize the light beams moving toward the liquid crystal display panel.

A lower prism sheet 25 and an upper prism sheet 26 are laid on the lower diffusion sheet 24 in this order. The prism sheet is formed with grooves in a surface thereof, the grooves having a triangular sectional shape and extending in one direction. The prism sheet is adapted to concentrate the light beams on the apices of the triangles, playing the role of efficiently directing the outgoing light beams from the light guide plate 22 toward the liquid crystal display panel. The grooves having the triangular section and formed in the surface of the prism sheet have a pitch of 50 μm, for example. The lower prism sheet 25 plays the role of concentrating the light beams moving transversely of the screen in a direction toward the liquid crystal display panel, for example, whereas the upper prism sheet 26 plays the role of concentrating the light beams moving vertically of the screen in a direction toward the liquid crystal display panel. Therefore, the grooves of the lower prism sheet 25 and of the upper prism sheet 26 extend substantially square to each other.

An upper diffusion sheet 27 is formed on the upper prism sheet 26. The TFT substrate 1 of the liquid crystal display panel is formed with scanning signal lines, data signal lines and the like in a matrix form. If these scanning line, the data signal lines or the like interfere with the grooves extending in one direction of the prism sheet, moiré occurs. The upper prism sheet 26 serves to reduce the moiré.

The outgoing light beams from the upper diffusion sheet 27 are linearly polarized by means of the lower polarizer 12 affixed to the lower side of the TFT substrate 1. The linear polarized light beams are controlled by the liquid crystal layer of the liquid crystal display panel, and detected by the upper polarizer 11 affixed to the upper side of the color filter substrate 2, whereby an image is formed. As described above, the liquid crystal display panel, the flexible wiring substrate 5, the backlight and the like are installed in the mold 6. The whole body of mold 6 is normally housed in the frame 7 formed from a metal.

Figure 3:
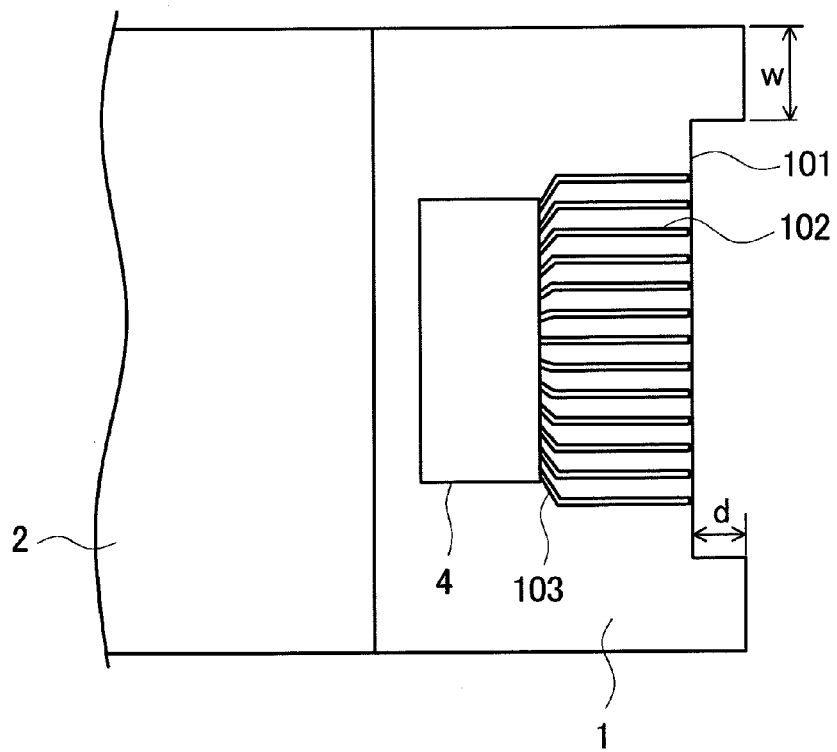
FIG. 3 is a schematic plan view of a liquid crystal display panel of the first embodiment.

FIG. 3 is a schematic plan view showing an example of the embodiment wherein the TFT substrate 1 is cut away at a portion corresponding to a terminal portion 102 thereof, to which the flexible wiring substrate 5 is mounted. The terminal portion 102 for connection with the flexible wiring substrate 5 and the like is formed in the vicinity of the notch. The driving IC chip 4 and the terminal portion 102 are interconnected via wiring 103. Wirings other than that for connection with the terminal portion 102 are omitted. Referring to FIG. 3, the notch has a depth d in the range of 0.2 mm to 1 mm. On the other hand, it is desirable to provide a margin w of about 5 mm at the side of the notch 101 because if the margin is too small, the glass is prone to be chipped.

Figure 4:
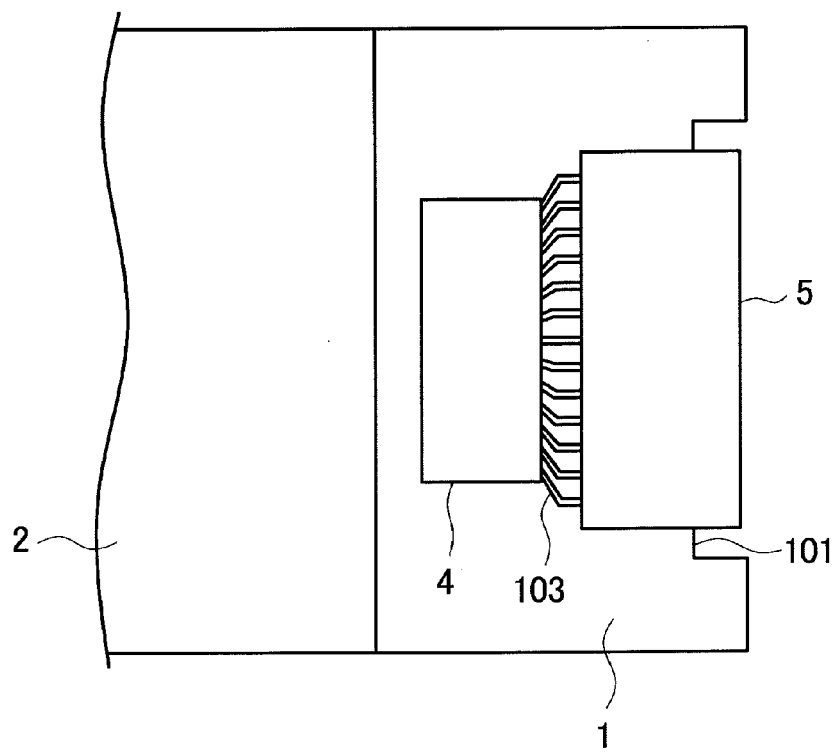
FIG. 4 is a schematic diagram showing the liquid crystal display panel of FIG. 3 connected with a flexible wiring substrate.
Figure 5:
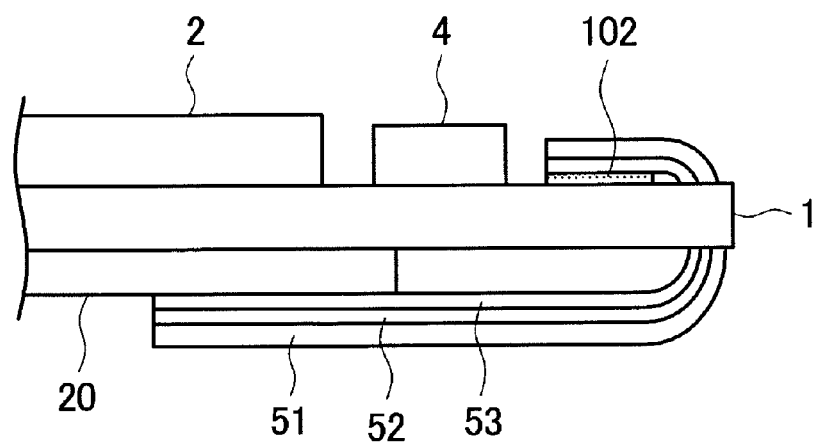
FIG. 5 is a schematic sectional view of the first embodiment.

FIG. 4 shows a state where the flexible wiring substrate 5 is mounted to the TFT substrate 1. In FIG. 4, the flexible wiring substrate 5 is bent over toward place beneath the TFT substrate 1. Referring to FIG. 4, the thickness and bend allowance of the flexible wiring substrate 5 are accommodated by the depth d of the notch 101 in the TFT substrate 1. FIG. 5 is a schematic side view of the state shown in FIG. 4. Referring to FIG. 4, the TFT substrate 1 has the driving IC chip 4 mounted thereto, and also has the flexible wiring substrate 5 mounted to place where the notch 101 is formed. FIG. 5 shows the state where the bent portion of the flexible wiring substrate 5 is accommodated in the notch 101 shown in FIG. 4. As shown in FIG. 5, the flexible wiring substrate 5 comprises: a base film 51 formed from polyimide or the like; a copper wiring 52; and a cover film 53 formed from polyimide or the like. The base film 51 has a thickness of, for example, 40 μm; the copper wiring has a thickness of, for example, 20 μm; and the cover film 53 has a thickness of, for example, 20 μm. Referring to FIG. 5, the flexible wiring substrate 5 is extended toward the backlight. The details of the backlight have been described with reference to FIG. 2 and hence, the description is dispensed with.

Figure 6:
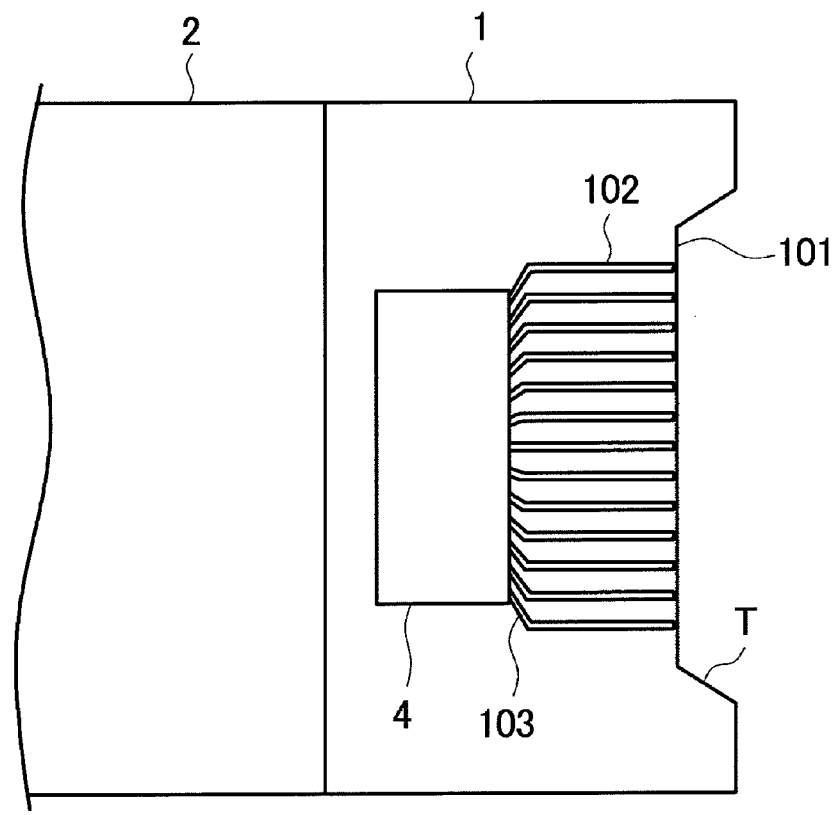
FIG. 6 is a schematic plan view showing the liquid crystal display panel according to another mode of the first embodiment.
Figure 7:
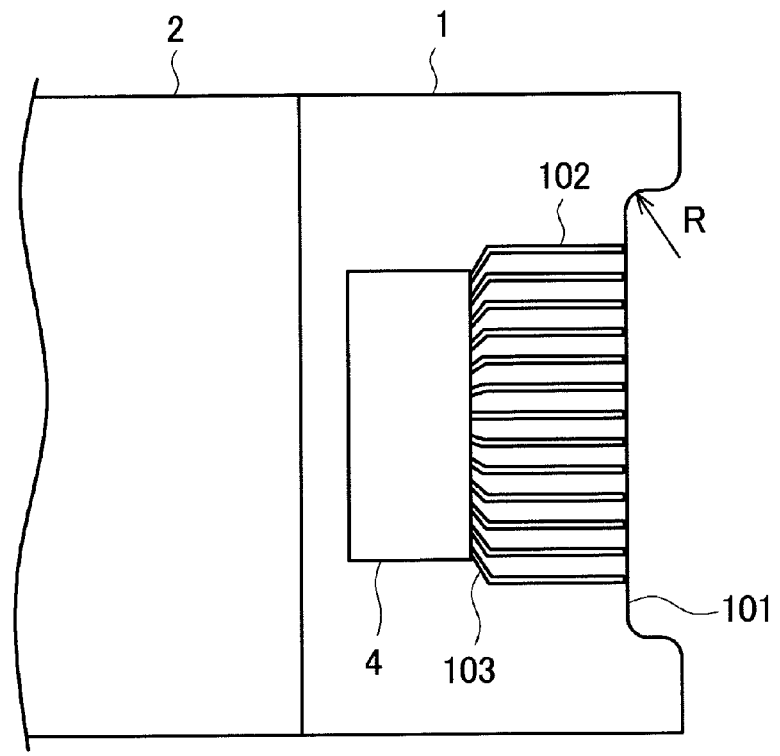
FIG. 7 is a schematic plan view showing the liquid crystal display panel according to still another mode of the first embodiment.

FIG. 6 shows another example of the notch 101. The TFT substrate 1 is normally formed from glass and hence, is prone to be chipped at corners. In FIG. 6, the notch 101 is formed with a taper T in order to obviate the chip. FIG. 7 shows still another example of the notch 101. In FIG. 7, the notch 101 of the TFT substrate 1 is formed with a rounded part R at the corner thereof in order to obviate the chip.

A laser cutting process is known as a method of forming the notches 101, as shown in FIG. 3, FIG. 6, FIG. 7, in the TFT substrate 1. The laser cutting process fusingly severs the glass substrate by irradiating an intensive laser beam on a cut-away portion. Unlike a scribing process or the like, the laser cutting process is characterized by producing no fine cracks at the cut-away portion.

Another method of forming the notch 101, as shown in FIG. 3, FIG. 6, FIG. 7, in the TFT substrate 1 is a sand blasting process wherein the notch 101 is formed by removing the cut-away portion by way of sand blast. After the substrate formed with many liquid crystal display panels is divided into the individual liquid crystal display panels with a cutter or by means of the scribing process, a necessary portion of each of the liquid crystal display panels is sand blasted to remove the cut-away portion so as to form the notch 101.

Figure 8:
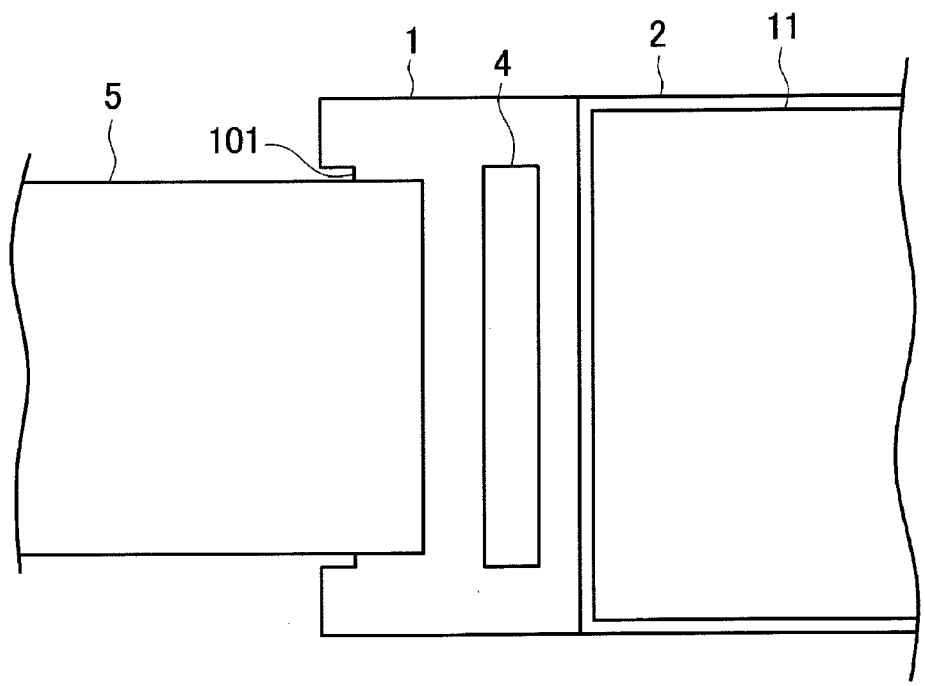
FIG. 8 is a plan view showing the liquid crystal display panel connected with the flexible wiring substrate.

FIG. 8 shows a state where the liquid crystal display panel has the flexible wiring substrate 5 mounted thereto before the liquid crystal display panel is installed in the mold 6. A difference from FIG. 4 consists in that the flexible wiring substrate 5 is yet to be bent. FIG. 8 does not depict the wiring and the like. Referring to FIG. 8, an area to which the upper polarizer 11 is affixed substantially corresponds to the viewing screen of the liquid crystal display panel. FIG. 9 shows a state where the liquid crystal display panel with the flexible wiring substrate 5 mounted thereto is installed in the mold 6. As shown in FIG. 9, the flexible wiring substrate 5 is bent over toward the lower side of the liquid crystal display panel when the substrate is installed in the mold 6.

Figure 10A:
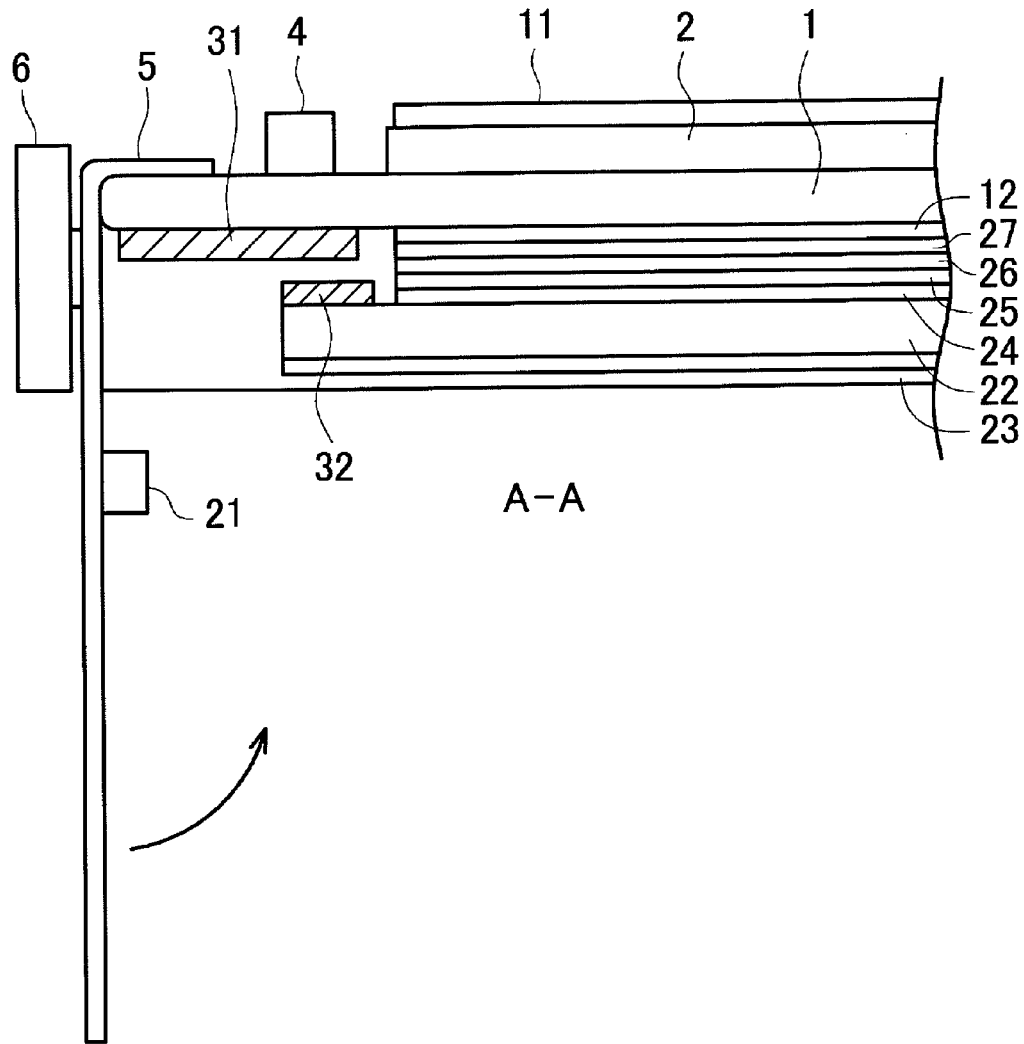
FIG. 10A is a sectional view taken on the line A-A in FIG. 9.
Figure 10B:
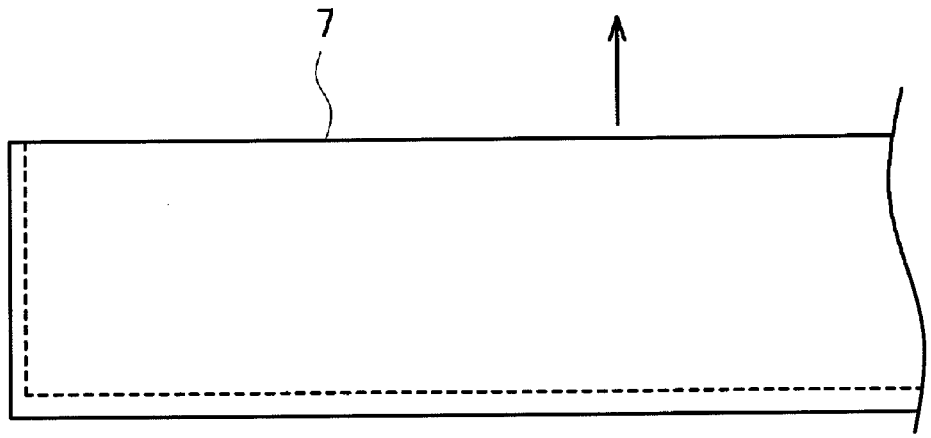
FIG. 10B shows a frame.

FIG. 10A is a sectional view taken on the line A-A in FIG. 9. FIG. 10A shows a state where the flexible wiring substrate 5 is yet to be bent over toward a back side of the backlight. Referring to FIG. 10A, the LED 21 as the light source of the backlight is mounted to the flexible wiring substrate 5. When the mold 6 accommodating therein the liquid crystal display panel, the backlight and the like is housed in the frame 7, as shown in FIG. 10B, the flexible wiring substrate 5 is bent in a direction of an arrow. The IED 21 mounted to the flexible wiring substrate 5 is automatically set to place beside the light guide plate 22. While the mold 6 shown in FIG. 10A is free of bottom so that the light guide plate 22 and the like seem to be afloat in midair, the mold 6 is formed with the supporting portion at a side thereof for supporting optical members including the light guide plate and the like. The frame 7 shown in FIG. 10B is formed of a stainless steel sheet having a thickness of 0.3 mm.

According to the embodiment, the flexible wiring substrate 5 is accommodated in the mold 6 with respect to at least a planar direction. Hence, the flexible wiring substrate 5 may be protected from the external force to separate the flexible wiring substrate from the liquid crystal display panel. Further, the mold 6 may be reduced in outside configuration including fractional dimensions.

Second Embodiment

Figure 11:
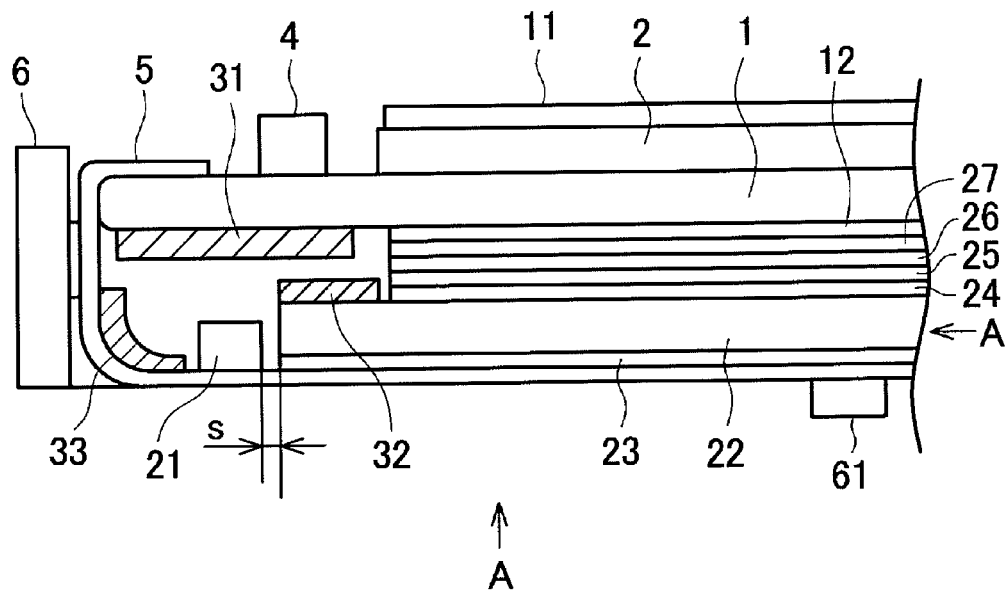
FIG. 11 is a sectional view of a second embodiment of the invention.

The first embodiment is arranged such that the mold 6 accommodating therein the liquid crystal display panel and the flexible wiring substrate 5 is housed in the metal frame 7. On the other hand, the invention is constituted such that the flexible wiring substrate 5 does not cover the mold 6 but is bent over toward the rear side as accommodated in the mold 6. This embodiment is designed to omit the metal frame 7 by utilizing the constitution of the invention. FIG. 11 is a schematic sectional view showing an arrangement of the second embodiment. The second embodiment potentially involves a fear of leakage of light from the LED 21 because a peripheral area of the LED is not covered by the frame 7.

Figure 12:
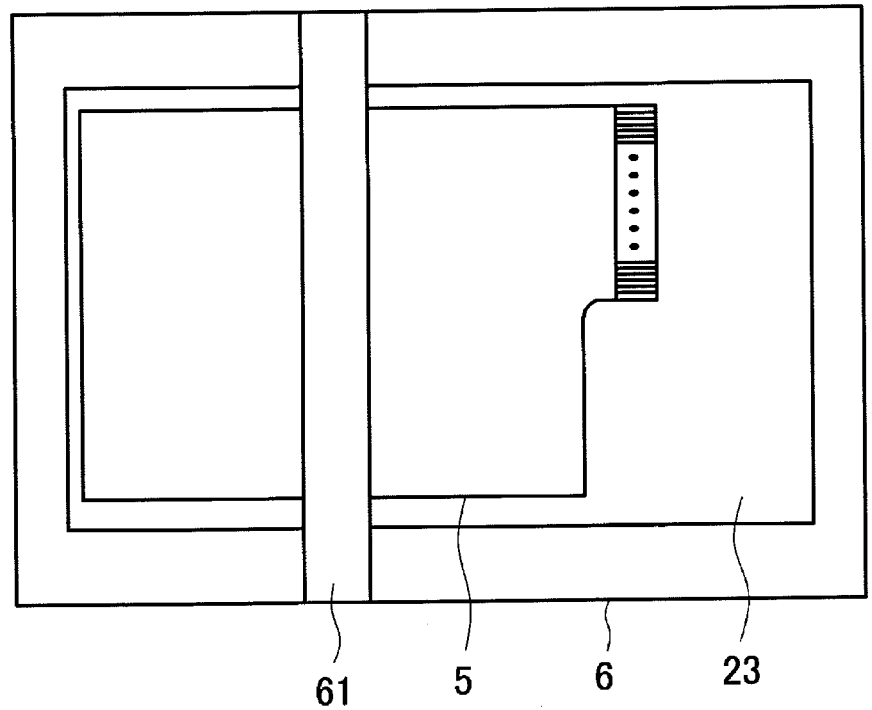
FIG. 12 is a rear view of the second embodiment.

This embodiment deals with this problem by adopting the following arrangement. As a first measure, a light shielding layer 33 or a light reflecting layer is formed on flexible wiring substrate 5 at an area surrounding the LED 21 thereby preventing the light from the LED 21 from leaking through the flexible wiring substrate 5. As a second measure, means for shifting the light guide plate 22 in a direction of an arrow A in FIG. 12 is formed between the mold 6 and the light guide plate so as to eliminate space between the LED 21 and the light guide plate 22, thereby preventing the leakage of the light from the LED 21. Such an arrangement obviates the leakage of the light from the LED 21 and provides an efficient use of the LED as the backlight of the liquid crystal display panel.

The mold 6 of the embodiment is free of bottom and hence, is provided with a stopper 61 such as to fix the flexible wiring substrate 5 to a lower side of the reflection sheet 23. FIG. 12 shows the arrangement of FIG. 11 as viewed in the direction of the arrow A in FIG. 11. FIG. 12 shows how the flexible wiring substrate 5 is supported by the stopper 61. The stopper 61 plays the role of fixing the flexible wiring substrate 5 to the lower side of the reflection sheet 23. Therefore, the stopper may be anything easy to install. The stopper may be formed from the same resin as that of the mold 6, or may be formed from a metal. The stopper 61 of the embodiment is assumed to be mounted after the optical sheets, the flexible wiring substrate 5 and the like are installed in the mold 6.

The arrangement of the second embodiment is adapted for the reduction of manufacture cost because the less costly stopper 61 may be used in place of the frame member. In addition, the physical size of the embodiment may be reduced by virtue of the omission of the frame 7.

Third Embodiment

Figure 13:
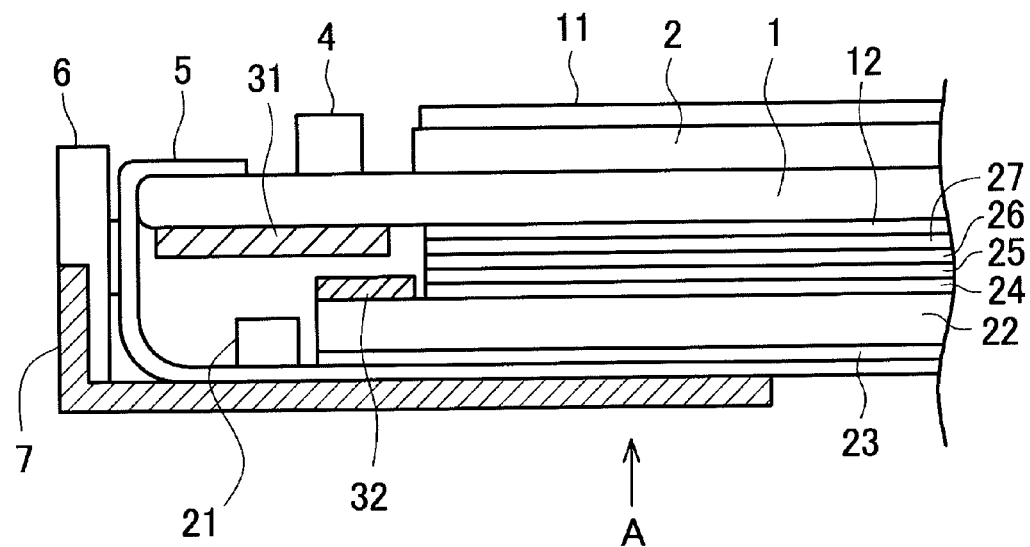
FIG. 13 is a sectional view of a third embodiment of the invention.

FIG. 13 illustrates a third embodiment of the invention. Referring to FIG. 13, the frame 7 is designed to be fitted on a lower part of the mold 6 rather than to house the whole body of the mold 6 therein. Unlike a conventional example, the mold 6 of the invention is not covered by the flexible wiring substrate 5 on an outside thereof. According to the invention, the flexible wiring substrate 5 is bent back as accommodated in the mold 6. Unlike the conventional example, therefore, the frame 7 does not play the role of accommodating therein the flexible wiring substrate 5 with respect to a planar direction of the display device. Accordingly, the embodiment may adopt the arrangement wherein the frame 7 is brought into engagement with a part of the mold 6, as shown in FIG. 13. Such an arrangement ensures that the frame 7 blocks off the peripheral area of the LED from outside so that the use efficiency of the light from the LED 21 may not be lowered. Since the frame 7 partially covers the bottom of the mold 6, the frame 7 may be used as the stopper for the flexible wiring substrate 5.

Figure 14:
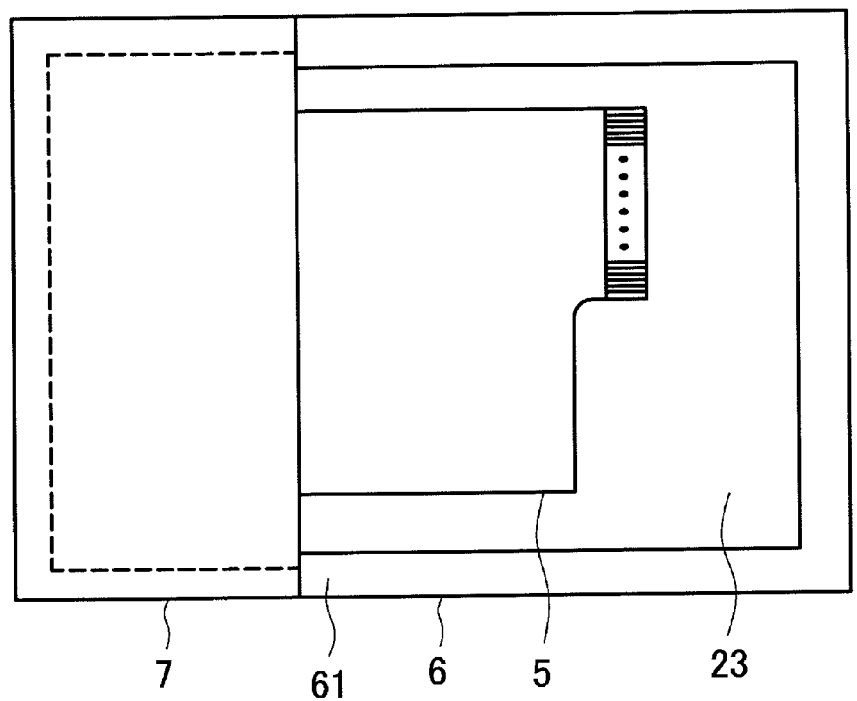
FIG. 14 is a rear view of the third embodiment.

FIG. 14 shows the frame of FIG. 13 as viewed in the direction A in FIG. 13. The bottom of the mold 6 is partially covered by the frame 7. The portion of the frame 7, which covers the flexible wiring substrate 5, serves as the stopper for the flexible wiring substrate 5. The LED 21 and the like are mounted to the flexible wiring substrate 5 at its portion covered by the frame 7, which portion shields the light source from outside.

While FIG. 13 and FIG. 14 show the arrangement wherein only a part of the bottom of the mold 6 is covered by the frame 7, it goes without saying that the overall bottom of the mold 6 may be covered by the frame 7. In this case, as well, the frame 7 is adapted to be brought into engagement with the lower part of the side of the mold 6, just as described above. The whole body of the backlight may be more completely shielded from outside by covering the overall bottom of the mold 6 with the frame 7. Further, needless to say, respective optical sheets can be supported more stably.

As described above, the embodiment offers an advantage that the frame 7 is utilized for positively shielding the backlight from outside and for stably fixing the individual optical members to places. In addition, at least the frame 7 per se may contribute to the reduced physical size of the display device, as compared with that of the conventional example.

Fourth Embodiment

Figure 15:
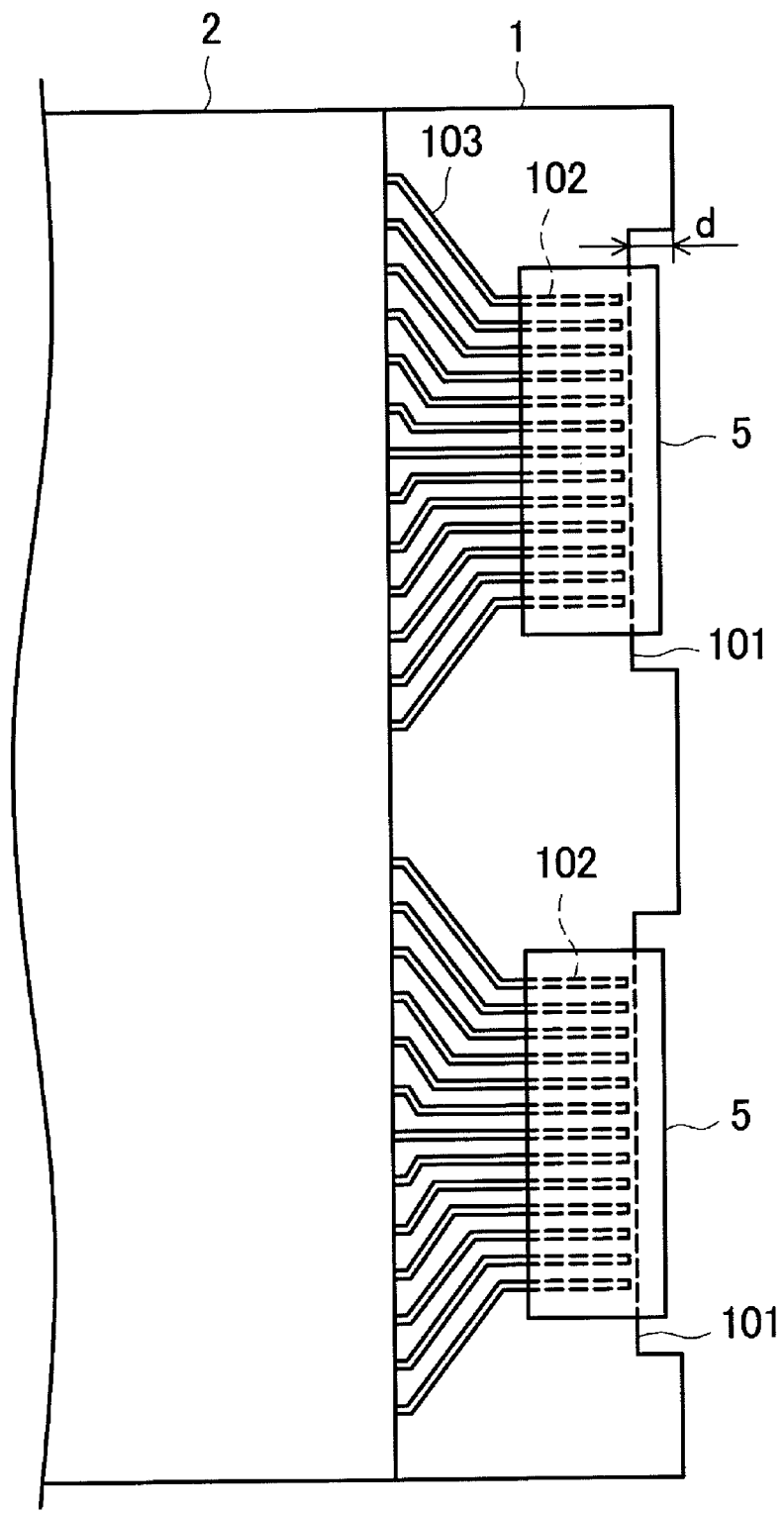
FIG. 15 is a plan view showing a terminal portion of the liquid crystal display panel according to one mode hereof.

The fourth embodiment illustrates a variety of modes of the notch 101 of the TFT of the liquid crystal display panel. FIG. 15 illustrates a case where two flexible wiring substrates 5 are mounted to the same side of the TFT substrate 1. In FIG. 15, both of the flexible wiring substrates 5 are bent over toward the lower side of the TFT substrate 1. In this case, as well, the depth d of the notch 101 is defined taking the thickness and bend allowance of the flexible wiring substrate 5 into consideration. While the driving IC chip 4 is not mounted to the TFT substrate 1 in the example of FIG. 15, the same may of course applies to a case where the driving IC chip is mounted.

Figure 16:
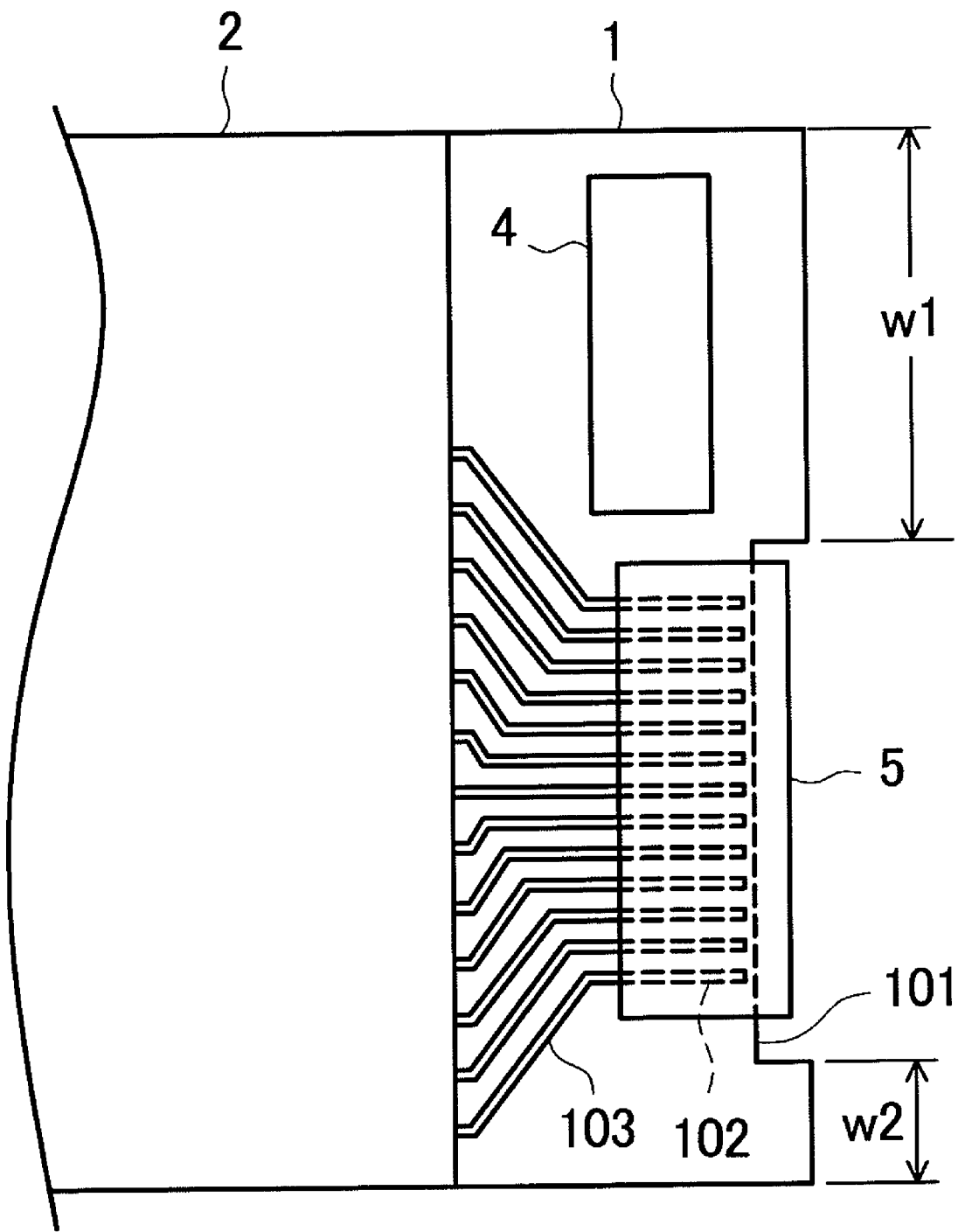
FIG. 16 is a plan view showing a terminal portion of the liquid crystal display panel according to another mode hereof.

FIG. 16 illustrates another example where the notch 101 is formed in the TFT substrate 1. In the example of FIG. 16, as well, the flexible wiring substrate 5 is bent over toward the lower side of the TFT substrate 1. In the example of FIG. 16, a protruded area except for the notch 101 includes a portion having a greater width w1 and a portion having a smaller width w2. The driving IC chip 4 and its wiring are disposed at the portion having the greater width w1. This arrangement provides an effective use of space at the protruded area left after cutting the notch. In addition, the width reduction of the overall liquid crystal display panel may be achieved by locating the driving IC chip 4 at place corresponding to the protruded portion.

Referring to FIG. 16, the phrase "locating the driving IC chip 4 at place corresponding to the protruded portion" does not necessarily mean that the driving IC chip 4 is disposed at the protruded portion. The driving IC chip 4 requires wiring to be laid at a peripheral area thereof. The space saving may also be achieved by disposing the wiring at the protruded portion.

Figure 17:
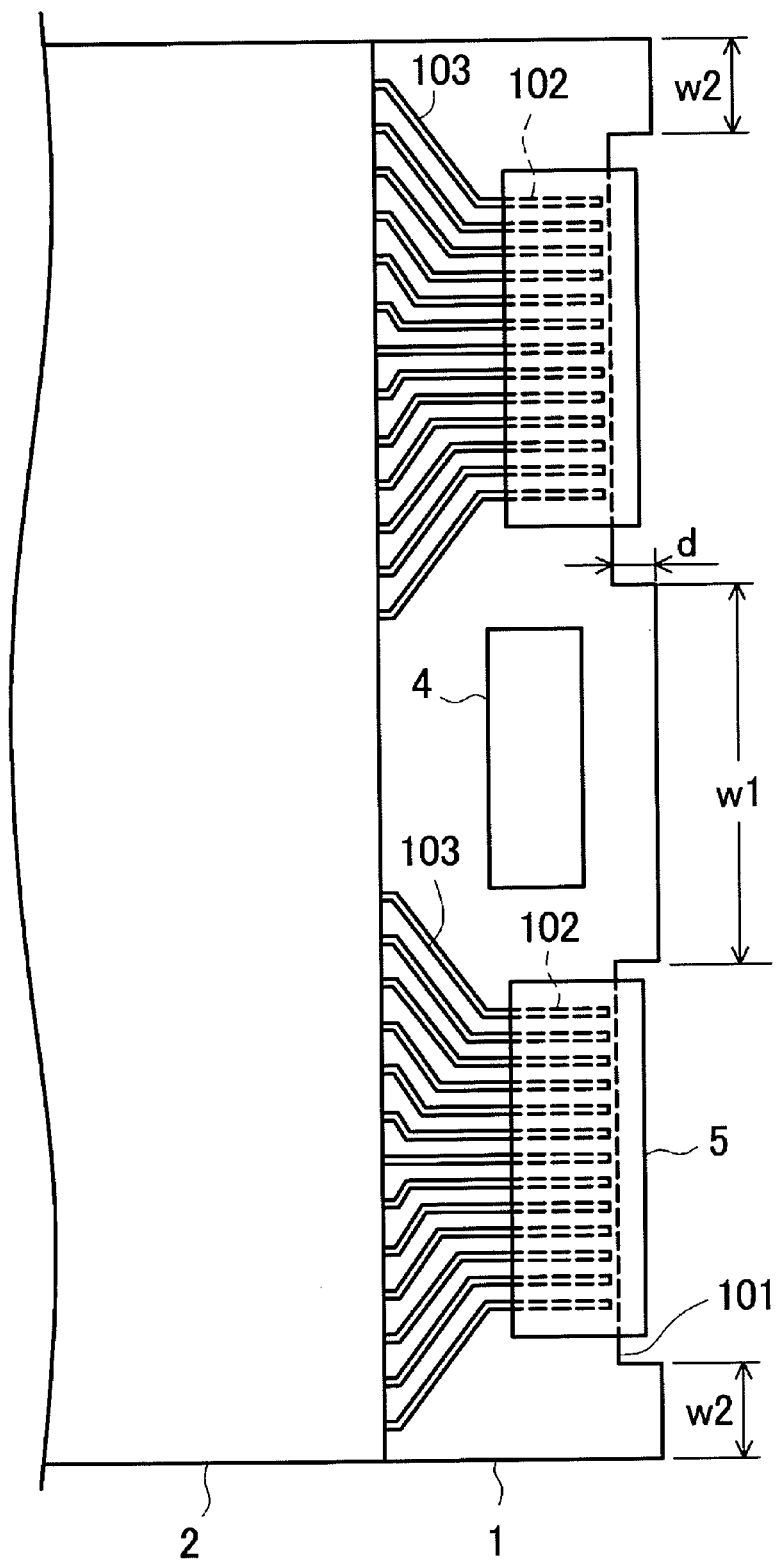
FIG. 17 is a plan view showing a terminal portion of the liquid crystal display panel according to still another mode hereof.

FIG. 17 illustrates an example where the TFT substrate 1 is formed with two notches 101, each of which is provided with the flexible wiring substrate 5. In the example of FIG. 17, as well, the two flexible wiring substrates 5 are bent over toward the lower side of the TFT substrate 1. In the example of FIG. 17, a protruded portion between the two notches 101 has the greater width w1 than the width w2 of protruded portions on the opposite sides of the substrate. The driving IC chip 4 is disposed at place corresponding to the central protruded portion having the width w1. Thus, the space at the protruded portion may be effectively used so that the overall display device may be reduced in physical size.

Needless to say, the phrase "the driving IC chip 4 is disposed at place corresponding to the protruded portion" is not limited to the case where the driving IC chip 4 is disposed at the protruded portion but also includes a case where the wiring associated with the driving IC chip 4 is laid at the central protruded portion. The arrangement wherein the driving IC chip 4 is disposed at place between the two notches 101 permits the opposite flexible wiring substrates 5 to supply signals, power and the like to the driving IC chip 4. This is quite an efficient approach.

Figure 18:
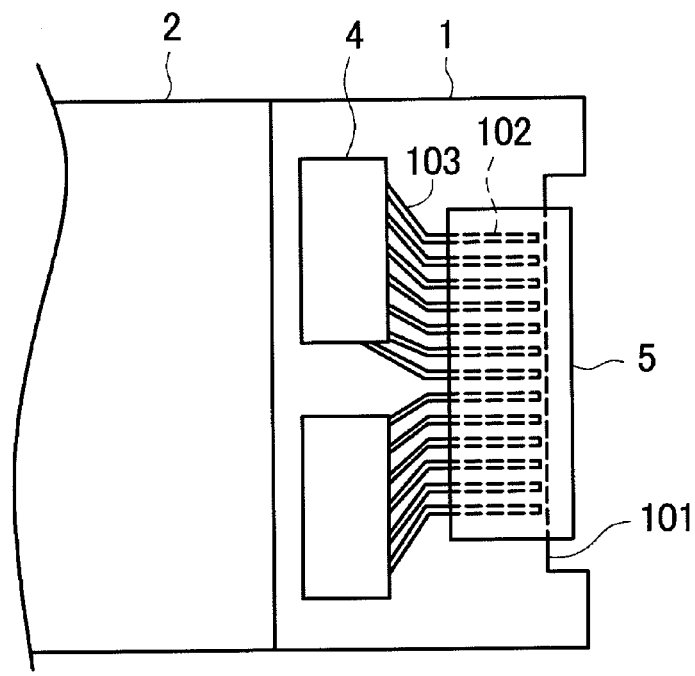
FIG. 18 is a plan view showing a terminal portion of the liquid crystal display panel according to yet another mode hereof.

FIG. 18 illustrates an example where the TFT substrate 1 is formed with the notch 110, at which terminals for connection with the flexible wiring substrate 5 are disposed, and where the terminals are connected with plural driving IC chips 4. In the example of FIG. 18, as well, the flexible wiring substrate 5 is bent over toward the lower side of the TFT substrate 1. The plural IC chips are arranged in parallel. This arrangement also achieves the efficient use of space at the TFT substrate 1 by utilizing the spaces of protruded portions on the opposite sides of the notch for laying the wirings to the driving IC chips 4.

Figure 19:
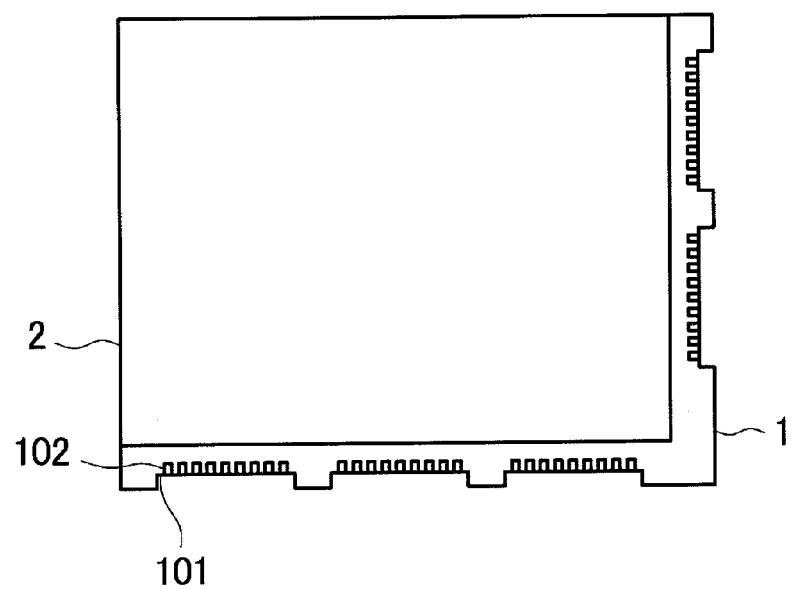
FIG. 19 is a plan view showing a terminal portion of the liquid crystal display panel according to still another mode hereof.

FIG. 19 is a plan view illustrating an example where the terminal portions 102 for supplying signals, power and the like to the liquid crystal display panel are formed at two sides of the TFT substrate 1. Referring to FIG. 19, the TFT substrate 1 is formed in a larger size than that of the color filter substrate 2 in order to allow for space where the terminals and the like are disposed. The terminals are formed at the long side and the short side of the TFT substrate 1. In FIG. 19, the long side of the TFT substrate 1 is formed with three notches 101, whereas the short side thereof is formed with two notches 101. The terminal portions 102 are formed at the notches 101. In the example of FIG. 19, the TFT substrate is provided with three flexible wiring substrates 5 at the long side thereof and with two flexible wiring substrates 5 at the short side thereof. While FIG. 19 does not depict the driving IC chip 4, the wiring and the like, there is no essential difference between a case where the driving IC chip 4 is provided and otherwise. The features described with reference to FIG. 15 to FIG. 18 may also be applied to the case where the terminals are formed at two sides of the TFT substrate as illustrated by FIG. 19.

FIG. 15 to FIG. 19 illustrate the examples where the notch 101 is formed by cutting the substrate at a right angle to the side thereof. However, the configurations of the notch 101 are not limited to those illustrated by FIG. 15 to FIG. 19. It goes without saying that the configurations shown in FIG. 6, FIG. 7 and such are also applicable.

The foregoing embodiments have been described on assumption that the TFT substrate 1 or the color filter substrate 2 is formed from glass. However, even if the TFT substrate 1 or the color filter substrate 2 comprises a plastic substrate, for example, the invention may be applied the same way as in the first to fourth embodiments thereof.

The invention claimed is:

1. A liquid crystal display device comprising:
a TFT substrate comprising pixel electrodes and TFTs (thin film transistor) for controlling a signal to the pixel electrodes arranged in a matrix; and
a color filter substrate disposed in opposing relation with the TFT substrate and formed with color filters in correspondence to the pixel electrodes,
wherein the TFT substrate is formed with a terminal portion for applying an external signal to the TFTs,
wherein the terminal portion is formed at a notch which is formed at a side of the TFT substrate and which extends through the TFT substrate; and
wherein the terminal portion is connected with a flexible wiring substrate, and the flexible wiring substrate is bent over the notch so as to enable the flexible wiring substrate to extend at least partially within the notch toward a rear side of the TFT substrate.

2. A liquid crystal display device according to claim 1, wherein the notch has a depth of 0.2 mm to 1 mm from the side of the TFT substrate.

3. A liquid crystal display device according to claim 1, wherein a line interconnecting the side of the TFT substrate and a side of the notch along which terminals of the terminal portion are arranged forms an obtuse angle with respect to the side of the TFT substrate.

4. A liquid crystal display device according to claim 1, wherein a line interconnecting the side of the TFT substrate and a side of the notch, along which terminals of the terminal portion are arranged, includes a rounded portion.

5. A liquid crystal display device comprising:
a TFT substrate comprising pixel electrodes and TFTs (thin film transistor) for controlling a signal to the pixel electrodes arranged in a matrix; and
a color filter substrate disposed in opposing relation with the TFT substrate and formed with color filters in correspondence to the pixel electrodes;
wherein a liquid crystal display panel having the TFT substrate and the color filter substrate;
wherein the TFT substrate is formed with a terminal portion for applying an external signal to the TFTs;
wherein a backlight is formed at place on a rear side of the liquid crystal display panel;
wherein the liquid crystal display panel and the backlight are accommodated in a mold;

wherein the terminal portion is formed at a notch which is formed at a side of the TFT substrate and which extends through the TFT substrate;

wherein the terminal portion is connected with a flexible wiring substrate; and wherein the flexible wiring substrate is bent over the notch so as to enable the flexible wiring substrate to extend at least partially within the notch toward a rear side of the TFT substrate and is extended to place on a back side of the backlight.

6. A liquid crystal display device according to claim 5, wherein the notch has a depth of 0.2 mm to 1 mm from the side of the TFT substrate.

7. A liquid crystal display device according to claim 5, wherein the flexible wiring substrate is bent over toward a rear side of the TFT substrate as accommodated in the mold.

8. A liquid crystal display device according to claim 5, wherein a light emitting diode is mounted to the flexible wiring substrate and the light emitting diode serves as light source of the backlight due to the flexible wiring substrate extended to place on a back side of the backlight.

9. A liquid crystal display device comprising:
a TFT substrate comprising pixel electrodes and TFTs (thin film transistor) for controlling a signal to the pixel electrodes arranged in a matrix; and
a color filter substrate disposed in opposing relation with the TFT substrate and formed with color filters in correspondence to the pixel electrodes;
wherein a liquid crystal display panel having the TFT substrate and the color filter substrate;
wherein the TFT substrate is formed with a terminal portion for applying an external signal to the TFTs;
wherein a backlight is formed at place on a rear side of the liquid crystal display panel;
wherein the liquid crystal display panel and the backlight are accommodated in a mold which is provided with a frame at a bottom thereof;
wherein the terminal portion is formed at a notch which is formed at a side of the TFT substrate and which extends through the TFT substrate;
wherein the terminal portion is connected with a flexible wiring substrate; and
wherein the flexible wiring substrate is bent over the notch so as to enable the flexible wiring substrate to extend at least partially within the notch toward a rear side of the TFT substrate and is extended to place on a back side of the backlight.

10. A liquid crystal display device according to claim 9, wherein the notch has a depth of 0.2 mm to 1 mm from the side of the TFT substrate.

11. A liquid crystal display device according to claim 9, wherein the flexible wiring substrate is bent over toward a rear side of the TFT substrate as accommodated in the mold.

12. A liquid crystal display device comprising:
a TFT substrate comprising pixel electrodes and TFTs (thin film transistor) for controlling a signal to the pixel electrodes arranged in a matrix; and
a color filter substrate disposed in opposing relation with the TFT substrate and formed with color filters in correspondence to the pixel electrodes,
wherein a liquid crystal display panel having the TFT substrate and the color filter substrate,
wherein the TFT substrate is formed with a terminal portion for applying an external signal to the TFTs,
wherein a backlight is formed at place on a rear side of the liquid crystal display panel,
wherein the liquid crystal display panel and the backlight are accommodated in a mold,
wherein the mold is housed in a frame,
wherein the terminal portion is formed at a notch which is formed at a side of the TFT substrate and which extends through the TFT substrate,
wherein the terminal portion is connected with a flexible wiring substrate, and
wherein the flexible wiring substrate is bent over the notch so as to enable the flexible wiring substrate to extend at least partially within the notch toward a back side of the backlight.

* * * * *